United States Patent
McTiernan et al.

(10) Patent No.: US 6,475,263 B1
(45) Date of Patent: Nov. 5, 2002

(54) SILICON ALUMINUM ALLOY OF PREALLOYED POWDER AND METHOD OF MANUFACTURE

(75) Inventors: Brian J. McTiernan, Robinson Township, PA (US); Michael W. Peretti, Finleyville, PA (US); Jocelyne O. McGeever, Mars, PA (US)

(73) Assignee: Crucible Materials Corp., Syracuse, NY (US)

( * ) Notice: Subject to any disclaimer, the term of this patent is extended or adjusted under 35 U.S.C. 154(b) by 0 days.

(21) Appl. No.: 09/832,128

(22) Filed: Apr. 11, 2001

(51) Int. Cl.⁷ .................................................. B22F 3/00

(52) U.S. Cl. ............................... 75/249; 75/255; 75/339

(58) Field of Search ........................... 75/249, 255, 339

(56) References Cited

U.S. PATENT DOCUMENTS

| | | | | | |
|---|---|---|---|---|---|
| 4,402,905 | A | * | 9/1983 | Burke et al. | 419/10 |
| 4,926,242 | A | * | 5/1990 | Itoh et al. | 357/81 |
| 5,084,109 | A | * | 1/1992 | Sikka | |
| 5,120,352 | A | * | 6/1992 | Jackson et al. | 75/346 |
| 5,876,794 | A | * | 3/1999 | Huet | 427/214 |
| 6,214,177 | B1 | * | 4/2001 | Runkle | 204/192.15 |
| 6,312,535 | B1 | * | 11/2001 | Leatham et al. | 148/442 |

* cited by examiner

*Primary Examiner*—Ngoclan Mai
(74) *Attorney, Agent, or Firm*—Finnegan, Henderson, Farabow, Garrett & Dunner LLP

(57) ABSTRACT

A silicon base binary alloy of prealloyed powder having less than 10% aluminum, excluding zero. The alloy may be in the form of gas atomized prealloyed powder, which powder may be consolidated to form an article. Preferably, the article is a sputtering target.

8 Claims, No Drawings

SILICON ALUMINUM ALLOY OF PREALLOYED POWDER AND METHOD OF MANUFACTURE

DESCRIPTION OF THE INVENTION

1. Field of the Invention

The invention relates to a silicon-base alloy of prealloyed powder containing aluminum and is preferably in the form of gas atomized prealloyed powder suitable for consolidation to produce sputtering targets.

2. Background of the Invention

Planar and rotatable sputtering targets of a silicon base alloy containing aluminum have conventionally been produced using plasma spray techniques with elemental blended powder used as the feed stock. These targets are primarily used to provide conductive, scratch resistant, and glare resistant coatings to video flat panel displays as well as automotive glass.

These conventional targets are deficient in that the compositions thereof are not uniform as a result of the use of elemental powder, which results in non-uniformity of the finished, coated surface produced therefrom.

It is accordingly a primary object of the present invention to provide a binary silicon base alloy of prealloyed powder containing aluminum which may be used in the production of sputtering targets that provides advantages both in uniformity of composition and ease of target manufacture over conventional practices.

SUMMARY OF THE INVENTION

In accordance with the invention, a binary silicon-base alloy of prealloyed powder is provided having, in weight percent, less than 10 aluminum, excluding zero. Preferably, the alloy has 6% maximum aluminum, excluding zero, and more preferably, the alloy has about 6% aluminum.

The alloy may be in the form of gas atomized, prealloyed powder. This powder may be consolidated to form a consolidated article therefrom, which may be a sputtering target.

By the use of the practice of the invention, the consolidated article is characterized by a microstructure substantially free of unalloyed silicon and aluminum. This provides a high degree of uniformity throughout the structure of the article.

The binary alloy of prealloyed powder in accordance with the invention may be produced from a heat of the alloy that is gas atomized to produce prealloyed powder particles therefrom. The heat may be produced by vacuum induction melting.

DETAILED DESCRIPTION OF THE INVENTION

In accordance with the invention, samples of two gas atomized heats were tested with respect to spray evaluation. One was made using conventional practice with blended elemental powder and one was made using argon gas atomized silicon aluminum powder in accordance with the invention and identified as L1228. The compositions of these powders are shown in Table 1.

TABLE 1

| | Chemistry of Si-6% Al Powders | | | | | | | | | | |
|---|---|---|---|---|---|---|---|---|---|---|---|
| | Si | Al | Fe | Zr | Cu | P | Mn | Cr | C | O | N | S |
| Blend Elem. Pwdr. | Bal. | 6.13 | 0.010 | <0.005 | <0.003 | <0.005 | <0.005 | <0.005 | 0.010 | 0.051 | 0.002 | <0.001 |
| CRC L1228 | Bal. | 5.70 | 0.014 | <0.001 | <0.001 | <0.005 | <0.001 | <0.005 | 0.007 | 0.020 | 0.002 | <0.001 |
| CRC L1229 | Bal. | 5.79 | 0.043 | <0.013 | <0.001 | <0.005 | <0.001 | <0.005 | 0.009 | 0.020 | 0.002 | <0.001 |

The plasma spray coupons were cut and polished for examination using a scanning electron microscope (SEM) and energy dispersive X-ray analysis.

The examination demonstrated that the deposited layer made with prealloyed powder (L1228) was much more uniformed than that deposited from blended elemental powder. Specifically, with the elemental blended powder the deposited material was non-uniform in chemistry and aluminum-rich areas were present. With the deposited layer made with the prealloyed powder, the chemistry was uniform throughout and there was no measurable dilution from the original prealloyed powder. Consequently, the structure of the deposit resulting from prealloyed powder was much more uniform than the conventional product made with blended elemental powder. In addition, it did not contain any areas of free silicon crystals or pure aluminum which would have electrically conductive or scratch-resistant properties substantially different from the remainder of the deposit.

What is claimed is:

1. A binary alloy of gas atomized prealloyed powder consisting essentially of, in weight percent, less than 10 Al, excluding zero, and balance Si, said alloy being characterized by a uniform microstructure substantially free of unalloyed Si and Al.

2. A binary alloy of gas atomized prealloyed powder consisting essentially of, in weight percent, 6 maximum Al, excluding zero, and balance Si, said alloy being characterized by a uniform microstructure substantially free of unalloyed Si and Al.

3. A binary alloy of gas atomized prealloyed powder consisting essentially of, in weight percent, about 6 Al and balance Si, said alloy being characterized by a uniform microstructure substantially free of unalloyed Si and Al.

4. The alloy of claims 1, 2 or 3 in the form of a consolidated article.

5. A method for producing a binary alloy consisting essentially of, in weight percent, less than 10 Al, excluding zero, and balance Si, said method comprising:

producing a heat of said alloy;

gas atomizing said heat to produce prealloyed powder particles of said alloy;

wherein said alloy of said gas atomized powder particles is characterized by a uniform microstructure substantially free of unalloyed Si and Al.

6. The method of claim 5, wherein said heat is produced by vacuum induction melting.

7. The method of claims 5 or 6, wherein said alloy consists essentially of, in weight percent, 6 maximum Al, excluding zero, and balance Si.

8. The method of claims 5 or 6, wherein said alloy consists essentially of, in weight percent, about 6 Al and balance Si.

* * * * *